United States Patent
Lee et al.

(10) Patent No.: US 12,040,704 B2
(45) Date of Patent: Jul. 16, 2024

(54) VOLTAGE GENERATOR AND SEMICONDUCTOR DEVICE INCLUDING THE SAME

(71) Applicant: SAMSUNG ELECTRONICS CO., LTD., Suwon-si (KR)

(72) Inventors: Sungju Lee, Suwon-si (KR); Kyungsoo Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/063,777

(22) Filed: Dec. 9, 2022

(65) Prior Publication Data

US 2023/0216397 A1 Jul. 6, 2023

(30) Foreign Application Priority Data

Jan. 3, 2022 (KR) .......................... 10-2022-0000192
Mar. 15, 2022 (KR) .......................... 10-2022-0032140

(51) Int. Cl.
*H02M 3/07* (2006.01)
*H02M 1/00* (2006.01)
*G11C 5/14* (2006.01)

(52) U.S. Cl.
CPC ........... *H02M 3/07* (2013.01); *H02M 1/0025* (2021.05); *H02M 1/0041* (2021.05); *G11C 5/145* (2013.01)

(58) Field of Classification Search
None
See application file for complete search history.

(56) References Cited

U.S. PATENT DOCUMENTS

| | | | |
|---|---|---|---|
| 6,294,950 B1 | 9/2001 | Lee et al. | |
| 6,424,570 B1 | 7/2002 | Le et al. | |
| 6,774,708 B2 * | 8/2004 | Matsui | H02M 3/07 363/59 |
| 6,836,176 B2 * | 12/2004 | Zeng | H02M 3/073 327/535 |
| 7,733,160 B2 * | 6/2010 | Morita | H02M 3/07 327/536 |
| 7,956,673 B2 * | 6/2011 | Pan | H02M 3/07 327/530 |
| 9,515,544 B2 * | 12/2016 | Lin | H02M 1/08 |

(Continued)

FOREIGN PATENT DOCUMENTS

| | | |
|---|---|---|
| KR | 10-2001-0011502 | 2/2001 |
| KR | 10-2002-0057052 | 7/2002 |
| KR | 10-2014-0075337 | 6/2014 |

*Primary Examiner* — Thomas J. Hiltunen
(74) *Attorney, Agent, or Firm* — F. Chau & Associates, LLC

(57) ABSTRACT

A voltage generator includes a charge pump circuit including a first charge pump having a plurality of first pumping capacitors, and a second charge pump having a plurality of second pumping capacitors having a capacitance different from a capacitance of each of the plurality of first pumping capacitors. The charge pump circuit is configured to supply a power supply voltage to a power mesh. The voltage generator further includes a controller configured to output a control signal based on a target level of the power supply voltage, and an oscillator configured to output a clock signal to the charge pump circuit. The oscillator outputs the clock signal to one of the first charge pump and the second charge pump based on the control signal.

18 Claims, 16 Drawing Sheets

(56) References Cited

U.S. PATENT DOCUMENTS

| | | | |
|---|---|---|---|
| 9,659,602 B2 * | 5/2017 | Qiao | H02M 3/07 |
| 9,812,954 B1 * | 11/2017 | Kose | H02M 3/07 |
| 10,380,965 B2 * | 8/2019 | Wu | G09G 3/3696 |
| 2002/0084833 A1 | 7/2002 | Kim et al. | |
| 2006/0250177 A1 * | 11/2006 | Thorp | H02M 3/073 |
| | | | 327/536 |
| 2009/0058506 A1 | 3/2009 | Nandi et al. | |
| 2012/0154022 A1 | 6/2012 | Cazzaniga et al. | |
| 2014/0159792 A1 | 6/2014 | Kim | |

* cited by examiner

VOLTAGE GENERATOR AND SEMICONDUCTOR DEVICE INCLUDING THE SAME

CROSS-REFERENCE TO RELATED APPLICATION(S)

This application claims priority under 35 U.S.C. § 119 to Korean Patent Application No. 10-2022-0000192 filed on Jan. 3, 2022, and Korean Patent Application No. 10-2022-0032140 filed on Mar. 15, 2022, the disclosures of which are incorporated by reference herein in their entireties.

TECHNICAL FIELD

Example embodiments of the present disclosure relate to a voltage generator and a semiconductor device including the same.

DISCUSSION OF RELATED ART

A semiconductor device may include a voltage generator generating a power supply voltage utilized for operations using an external power supply voltage provided by an external host. For example, the voltage generator may output a power supply voltage of a level higher than a level of an external power supply voltage. The voltage generator may include a charge pump to generate a power supply voltage at a level higher than a level of an external power supply voltage. Operations of the charge pump may be controlled according to the target level of the power supply voltage.

SUMMARY

An example embodiment of the present disclosure provides a voltage generator which may include a plurality of charge pumps having different pumping capacitors, and which may, by adaptively selecting a selected charge pump actually outputting a power supply voltage from among the plurality of charge pumps with reference to a target level of a power supply voltage and process, voltage, temperature (PVT) information of a semiconductor device, reduce deterioration of properties according to the target level and stably maintain a charge supply of the charge pump, and a semiconductor device including the same.

According to an example embodiment of the present disclosure, a voltage generator includes a charge pump circuit including a first charge pump having a plurality of first pumping capacitors, and a second charge pump having a plurality of second pumping capacitors, and configured to supply a power supply voltage to a power mesh. The voltage generator further includes a controller configured to output a control signal based on a target level of the power supply voltage, and an oscillator configured to output a clock signal to the charge pump circuit. The oscillator outputs the clock signal to one of the first charge pump and the second charge pump based on the control signal, and a capacitance of each of the plurality of first pumping capacitors is different from a capacitance of each of the plurality of second pumping capacitors.

According to an example embodiment of the present disclosure, a voltage generator includes a plurality of charge pumps including pumping capacitors having different capacitances, a controller configured to determine a target level of a power supply voltage supplied to a predetermined circuit region through a power mesh and to output a control signal for determining a selected charge pump among the plurality of charge pumps based on the target level, and an oscillator configured to determine a frequency of a clock signal input to the selected charge pump based on a result of comparison between a reference voltage determined according to the control signal and a voltage detected by the power mesh.

According to an example embodiment of the present disclosure, a semiconductor device includes a plurality of memory regions, each of the plurality of memory regions including a power mesh supplying a power supply voltage, and a logic circuit configured to control the plurality of memory regions. The logic circuit includes a voltage generator configured to determine the power supply voltage supplied to the power mesh included in each of the plurality of unit memory regions to have a predetermined target level. The voltage generator includes a plurality of charge pumps configured to supply charges to the power mesh such that a level of the power supply voltage increases to the target level and is maintained at the target level, and a controller configured to select one of the plurality of charge pumps as a selected charge pump based on the target level.

BRIEF DESCRIPTION OF THE DRAWINGS

The above and other aspects and features of the present disclosure will become more apparent by describing in detail example embodiments thereof with reference to the accompanying drawings, in which.

DETAILED DESCRIPTION

Figure 1:
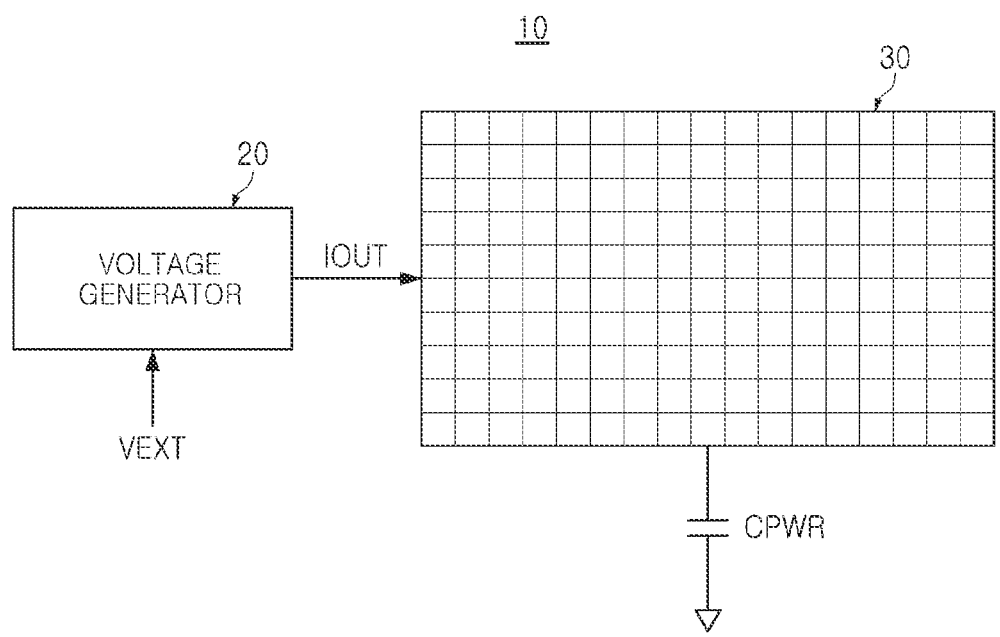
FIG. 1 is a diagram illustrating a semiconductor device according to an example embodiment of the present disclosure.

Hereinafter, embodiments of the present disclosure will be described more fully with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art. Other uses of these terms and similar terms to describe the relationships between components should be interpreted in a like fashion.

FIG. 1 is a diagram illustrating a semiconductor device according to an example embodiment.

Referring to FIG. 1, a semiconductor device 10 in an example embodiment may include a voltage generator 20 and a power mesh 30. The power mesh 30 may include metal wirings disposed on a circuit block performing a predetermined function in the semiconductor device 10 and may have a predetermined capacitance. The capacitance of the power mesh 30 may be represented as a power capacitor CPWR as illustrated in FIG. 1.

The voltage generator 20 may supply a power supply voltage utilized for operations of a circuit block included in the semiconductor device to the power mesh 30 using the external power supply voltage VEXT. For example, a voltage of the power mesh 30 may increase to a target level by the output current IOUT output by the voltage generator 20. In an example embodiment, charges may be supplied to the power mesh 30 by the output current IOUT, and when the voltage of the power mesh 30 increases to a target level by the supplied charge, the voltage generator 20 may stop outputting the output current IOUT.

The voltage generator 20 may include a charge pump providing an output current IOUT such that a power supply voltage of a level higher than a level of the external power supply voltage VEXT may be applied to the power mesh 30. For example, the charge pump may include switches turned on/off by a predetermined clock signal, and at least one pumping capacitor, and the amount of charges supplied to the charge pump may be varied according to a frequency of the clock signal.

According to example embodiments, the power mesh 30 may stably maintain the power supply voltage of the target level, and may reduce a ripple component included in the power supply voltage. As a result, the circuit block included in the semiconductor device may operate stably according to example embodiments. A magnitude of a ripple component included in the power supply voltage may be varied depending on the capacitance of the pumping capacitor included in the charge pump and the target level of the power supply voltage to be supplied to the power mesh 30. For example, as the target level decreases, the ripple component may increase. When the target level is increased, the ripple component may be reduced, but the amount of charge supply of the charge pump may be reduced instead.

An amount of charge supply of the charge pump may be affected by a capacitance of a pumping capacitor included in the charge pump. For example, when the capacitance of the pumping capacitor is large, the amount of charge supplied to the charge pump may increase, and when the capacitance of the pumping capacitor is small, the amount of charge supplied to the charge pump may decrease.

Accordingly, in an example embodiment, the voltage generator 20 may include two or more charge pumps including pumping capacitors having different capacitances. For example, the voltage generator 20 may control a single selected charge pump from among the two or more charge pumps to operate, and may control the other charge pump(s) to not operate according to the target level of the power supply voltage.

For example, when the target level is relatively low, a charge pump including a pumping capacitor of small capacitance may be activated, and when the target level is relatively large, a charge pump including a large capacitance pumping capacitor may be activated. Accordingly, under the condition of outputting a large target level at which the influence of a ripple component is relatively less, the power supply voltage of the target level may be stably provided to the power mesh 30 by sufficiently securing the amount of charge supply of the charge pump. Also, under a condition in which a small target level at which the influence of the ripple component is relatively large, by generating a power supply voltage using a charge pump having a pumping capacitor of small capacitance, the ripple component may be reduced.

Figure 2:
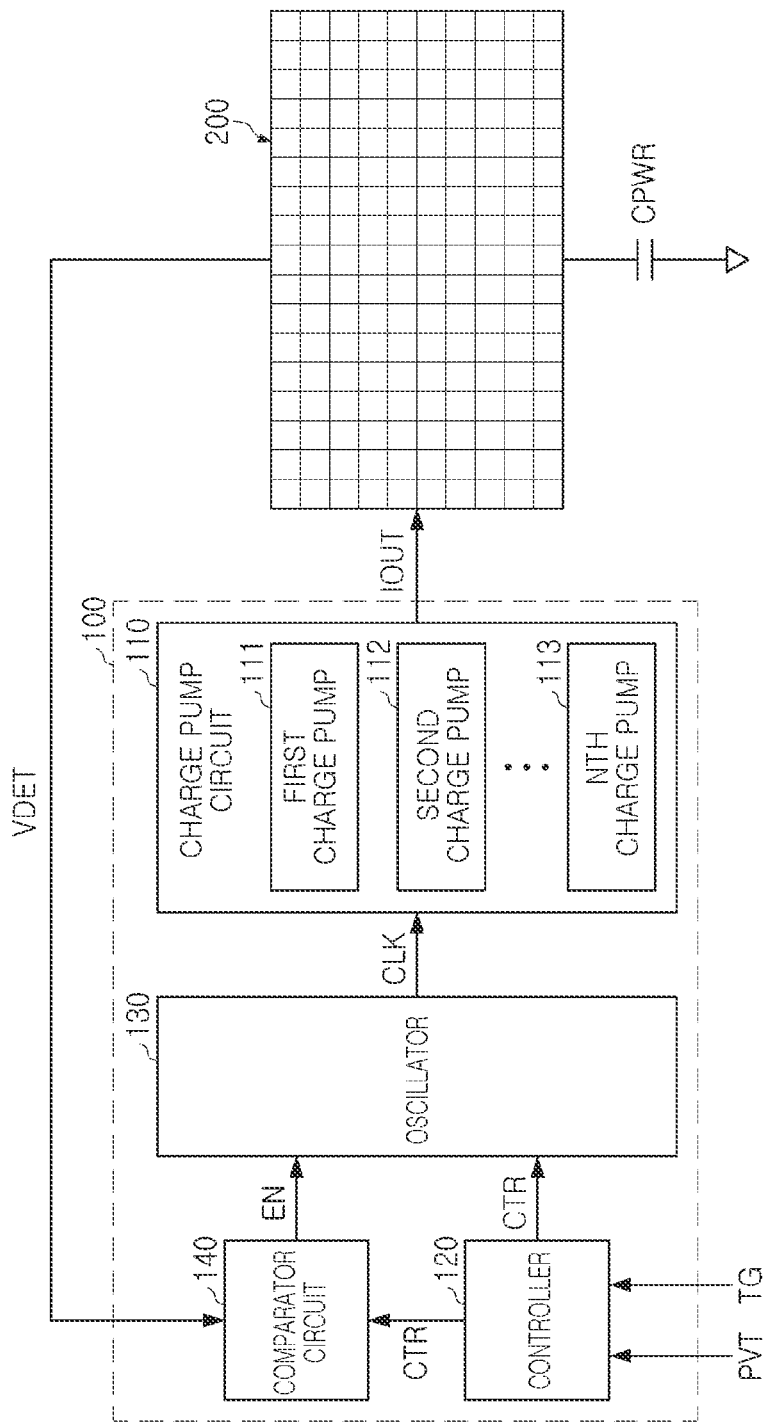
FIG. 2 is a block diagram illustrating a voltage generator according to an example embodiment of the present disclosure.

FIG. 2 is a block diagram illustrating a voltage generator according to an example embodiment.

Referring to FIG. 2, the voltage generator 100 in an example embodiment may include a charge pump circuit 110 including a plurality of charge pumps 111-113, a controller 120 (also referred to as a controller circuit), an oscillator 130 (also referred to as an oscillator circuit) and a comparator circuit 140. The output current IOUT output by the charge pump circuit 110 from the voltage generator 100 may be supplied to the power mesh 200 and may be used as a voltage utilized for operations of a circuit block connected to the power mesh 200.

Each of the plurality of charge pumps 111-113 included in the charge pump circuit 110 may include at least one switch element and at least one pumping capacitor. In an example embodiment, capacitances of the pumping capacitors included in the plurality of charge pumps 111-113 may be different. For example, a capacitance of the first pumping capacitor included in the first charge pump 111 may be different from a capacitance of the second pumping capacitor included in the second charge pump 112.

In an example embodiment according to FIG. 2, the charge pump circuit 110 may include N number of charge pumps 111-113 (N is a natural number equal to or greater than 3). However, example embodiments are not limited thereto, and the charge pumps 111-113 may be varied in example embodiments. In the voltage generator 100 in an example embodiment, the charge pump circuit 110 may include at least two or more charge pumps.

The controller 120 may control operations of the oscillator 130 and the comparator circuit 140. For example, the controller 120 may determine a selected charge pump from among the plurality of charge pumps 111-113 based on at least one of the process, voltage, temperature (PVT) information (PVTI) of the semiconductor device and the target level TG of the power supply voltage to be supplied to the power mesh 200. The controller 120 may deactivate the charge pumps other than the selected charge pump.

The oscillator 130 may output a clock signal CLK. The oscillator 130 may operate in response to a control signal from the controller 120. In an example embodiment, the oscillator 130 may output the clock signal CLK only to a selected charge pump among the plurality of charge pumps 111-113 in response to the control signal CTR transmitted from the controller 120, and may output the clock signal CLK to the other charge pumps. Accordingly, the selected charge pump determined by the controller 120 may operate and may supply the output current IOUT to the power mesh 200, and the power supply voltage of the power mesh 200 may increase to the target level TG due to the charge supplied by the output current IOUT.

Alternatively, the oscillator 130 may output the clock signal CLK to the plurality of charge pumps 111-113, and the controller 120 may control the clock signal CLK to be input to the selected charge pump among the plurality of charge pumps 111-113. In this case, a select circuit may be additionally connected between an output terminal of the oscillator 130 and an input terminal of the charge pump circuit 110. The select circuit may be implemented as, for example, a plurality of switch elements or a demultiplexer.

The controller 120 may also provide the control signal CTR to the comparator circuit 140. For example, the comparator circuit 140 may include a comparator comparing a reference voltage with a feedback voltage, and an output of the comparator may be input to the oscillator 130 as an enable signal EN. For example, whether the oscillator 130 operates may be determined according to the enable signal EN. When the oscillator 130 is activated and operates according to the enable signal EN, the charge pump circuit 110 may output the output current IOUT, and when the oscillator 130 stops operating according to the enable signal EN, the charge pump circuit 110 may also stop outputting the output current IOUT.

Among the voltages input to the comparator in the comparator circuit 140, a level of the feedback voltage may be determined by the sensing voltage VDET detected by the power mesh 200. The level of the reference voltage may be determined according to the control signal CTR output by the controller 120 to the comparator circuit 140. Accordingly, the controller 120 may determine whether the charge pump circuit 110 continues to supply the output current IOUT or stops supplying the output current IOUT using the control signal CTR.

For example, when it is determined that the level of the feedback voltage is sufficient, that is, when it is determined that the power supply voltage of the power mesh 200 has a sufficient level as compared to the target level TG, the controller 120 may output a control signal CTR for adjusting the reference voltage to be less than the feedback voltage. In this case, the oscillator 130 may be deactivated by the enable signal EN output by the comparator and the outputting of the clock signal CLK may stop, and the outputting of the output current IOUT may also stop.

When it is determined that the power supply voltage of the power mesh 200 is less than the target level TG, the controller 120 may output a control signal CTR for adjusting the reference voltage to be greater than the feedback voltage. Accordingly, the oscillator 130 may be activated by the enable signal EN, and the clock signal CLK may be input to the charge pump selected by the control signal CTR such that the output current IOUT may be applied to the power mesh 200. Due to the charge provided by the output current IOUT, the power supply voltage of the power mesh 200 may increase to the target level TG.

Figure 3A:
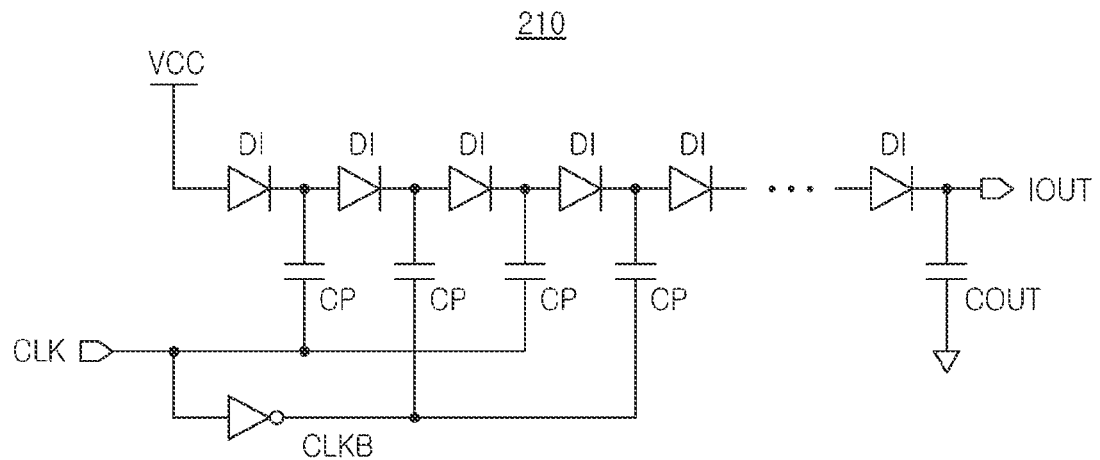
FIGS. 3A and 3B are circuit diagrams illustrating charge pumps included in a voltage generator according to an example embodiment of the present disclosure.
Figure 3B:
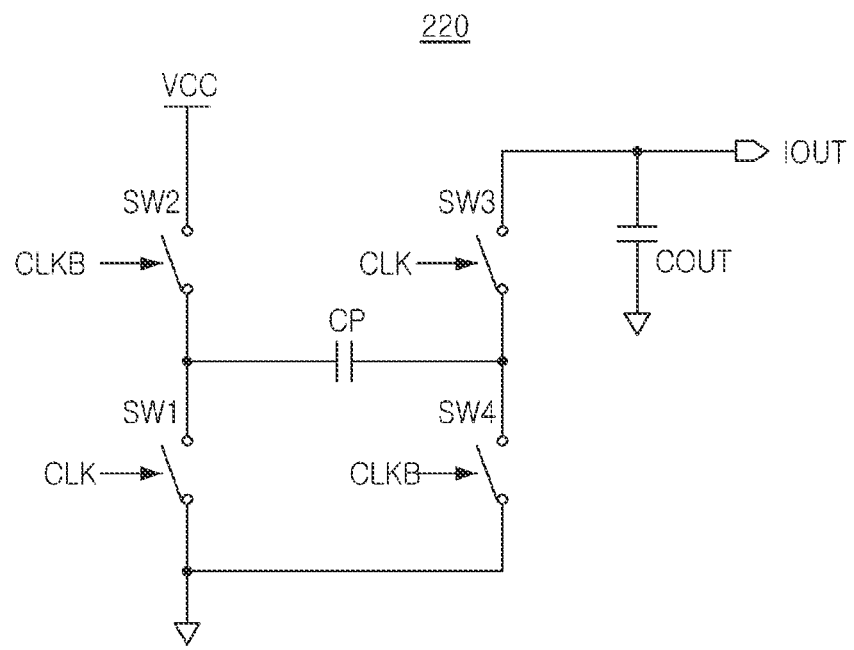

FIGS. 3A and 3B are circuit diagrams illustrating charge pumps included in a voltage generator according to an example embodiment.

Referring to FIG. 3A, the charge pump 210 included in the voltage generator in an example embodiment may include a plurality of diodes DI, a plurality of pumping capacitors CP, and an output capacitor COUT. The plurality of diodes DI may be connected to each other in series, and a plurality of pumping capacitors CP may be connected to a node disposed between the plurality of diodes DI. The first diode may receive a power supply voltage VCC having a predetermined level, and the last diode may output an output current IOUT to an output node.

Each of the plurality of pumping capacitors CP may be charged or discharged by the clock signal CLK or a complementary clock signal CLKB phase-shifted to have a phase opposite to that of the clock signal CLK by the inverter INV. For example, in an example embodiment according to FIG. 3A, the odd-numbered pumping capacitors CP may be charged or discharged by the clock signal CLK, and the even-numbered pumping capacitors CP may be charged or discharged by complementary clock signal CLKB.

As described above, the voltage generator may include a plurality of charge pumps. In an example embodiment, the pumping capacitors CP included in the plurality of charge pumps may have different capacitances.

Referring to FIG. 3B, the charge pump 220 included in the voltage generator in an example embodiment may include a plurality of switch elements SW1-SW4 and at least one pumping capacitor CP, and an output capacitor COUT. Among the plurality of switch elements SW1-SW4, the first switch element SW1 may receive the power supply voltage VCC, and the second switch element SW2 and the third switch element SW3 may be connected to a node to which a ground voltage is applied. The fourth switch element SW4 may be connected between the output node and the pumping capacitor CP.

The first switch element SW1 and the third switch element SW3 may be turned on/off by the clock signal CLK, and the second switch element SW2 and the fourth switch element SW4 may be turned on/off by the complementary clock signal CLKB. When the second switch element SW2 and the fourth switch element SW4 are turned on, charges may be charged in the pumping capacitor CP by the power supply voltage VCC. When the first switch element SW1 and the third switch element SW3 are turned on, the charge charged in the pumping capacitor CP may be shared with the output capacitor COUT, and the output current IOUT may be output through the output node.

Figure 4:
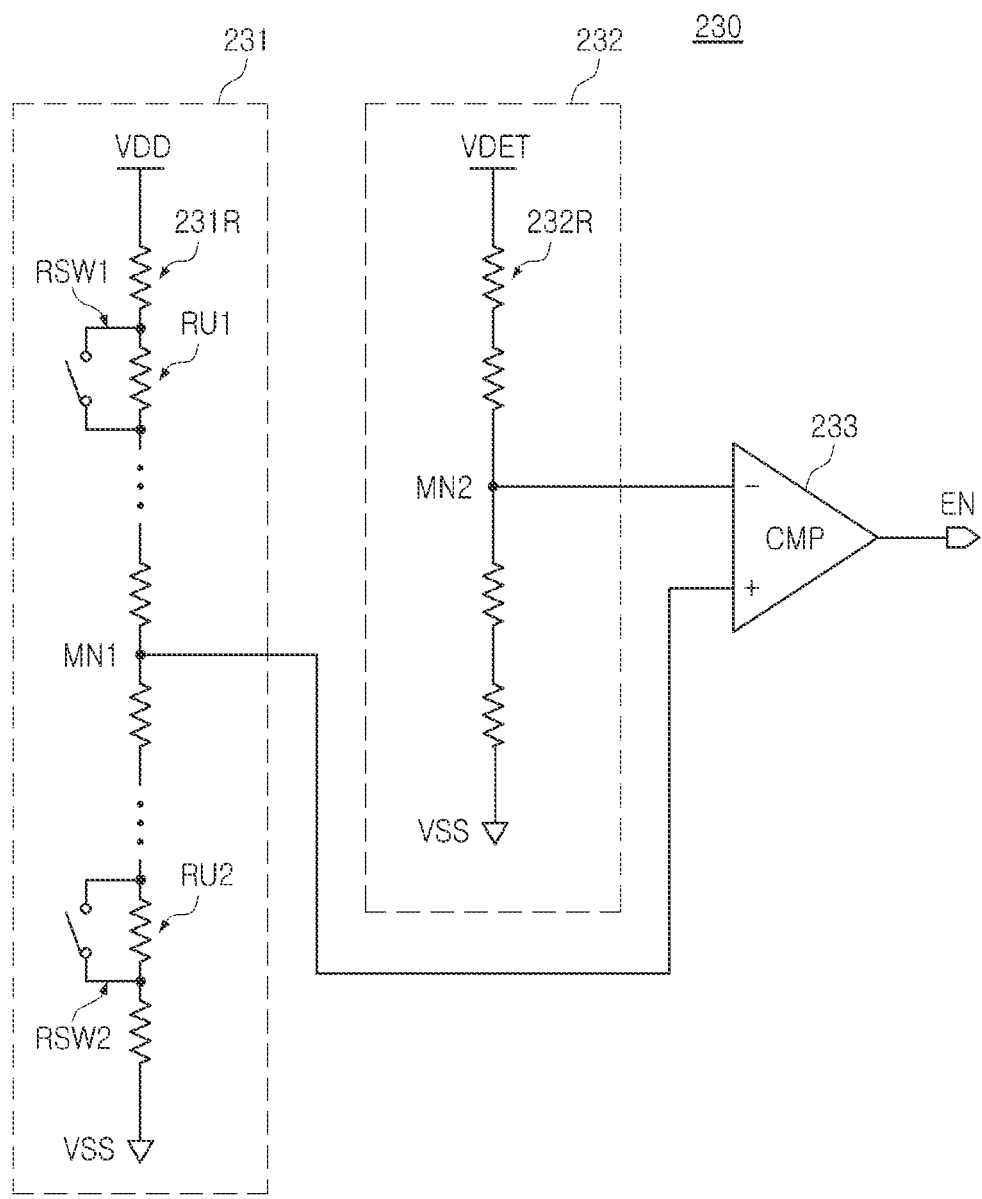
FIG. 4 is a circuit diagram illustrating a comparator circuit included in a voltage generator according to an example embodiment of the present disclosure.

FIG. 4 is a circuit diagram illustrating a comparator circuit included in a voltage generator according to an example embodiment.

Referring to FIG. 4, a comparator circuit 230 in an example embodiment may include a first voltage divider circuit 231, a second voltage divider circuit 232, and a comparator 233. The first voltage divider circuit 231 may include a plurality of unit resistors 231R connected between a first power node supplying the first power supply voltage VDD and a second power supply node supplying the second power supply voltage VSS, and at least one resistor switch RSW1 and RSW2. Herein, the terms "unit resistor" and "resistor" may be used interchangeably. The second voltage divider circuit 232 may include a plurality of unit resistors 232R connected between a node supplying the sensing voltage VDET and a second power node. The sensing voltage VDET may be a voltage detected by a power mesh connected to an output terminal of the voltage generator.

In an example embodiment according to FIG. 4, the first voltage divider circuit 231 may include a first resistor switch RSW1 and a second resistor switch RSW2. The first resistor switch RSW1 may be connected to the first unit resistor RU1 among the plurality of unit resistors 231R in parallel, and the second resistor switch RSW2 may be connected to a second unit resistor RU2 among the plurality of unit resistors 231R in parallel.

Referring to FIG. 4, a non-inverting input terminal of the comparator 233 may be connected to the first intermediate node MN1 of the first voltage divider circuit 231, and an inverting input terminal of the second voltage divider circuit 232 may be connected to the second intermediate node MN2. The comparator 233 may compare the voltage of the first intermediate node MN1 with the voltage of the second intermediate node MN2 and may determine the level of the enable signal EN. For example, the voltage of the first intermediate node MN1 may be defined as a reference voltage, and the voltage of the second intermediate node MN2 may be defined as a feedback voltage.

The enable signal EN may be a signal for determining whether an oscillator included in the voltage generator together with the comparator circuit 230 operates. In an example embodiment, when the enable signal EN is at a first level, the oscillator may be activated and may operate, and when the enable signal EN is at a second level different from the first level, the oscillator may be deactivated and stop operating.

In an example embodiment, when one of the first resistor switch RSW1 and the second resistor switch RSW2 is turned on, the other resistor switch may be turned off. For example, when the first resistor switch RSW1 is turned on, a voltage of the first intermediate node MN1 may increase, and when the second resistor switch RSW2 is turned on, the voltage of the first intermediate node MN1 may decrease. The turning on/off of the first resistor switch RSW1 and the second resistor switch RSW2 may be determined by a control signal output by a controller included in the voltage generator together with the comparator circuit 230.

For example, when the power supply voltage of the power mesh is less than the target level, the controller may turn on the first resistor switch RSW1 and may increase the voltage of the first intermediate node MN1. Accordingly, the enable signal EN may increase to a high level, and the oscillator may be activated and may output a clock signal to the charge pump, such that the charge pump may supply charges to the power mesh. When the power supply voltage of the power mesh is greater than the target level, the controller may turn on the second resistor switch RSW2 and may decrease the voltage of the first intermediate node MN1. In this case, the enable signal EN may decrease to a low level, and the oscillator may be deactivated and the charge pump may stop operating.

Figure 5:
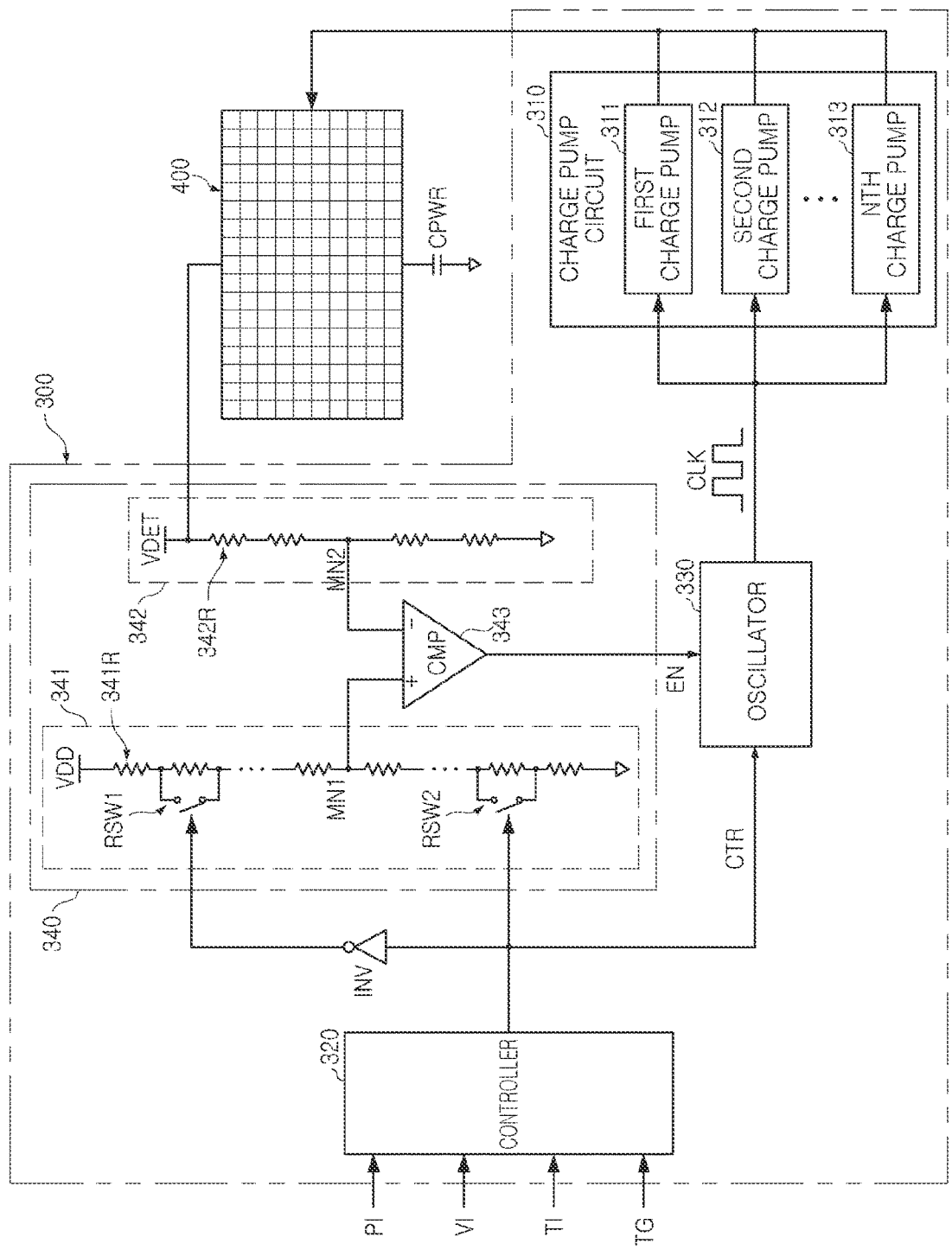
FIG. 5 is a diagram illustrating a voltage generator according to an example embodiment of the present disclosure.

FIG. 5 is a diagram illustrating a voltage generator according to an example embodiment.

Referring to FIG. 5, the voltage generator 300 in an example embodiment may include a charge pump circuit 310, a controller 320, an oscillator 330, and a comparator circuit 340. The charge pump circuit 310 may include a plurality of charge pumps 311-313, and at least one of the plurality of charge pumps 311-313 may be activated as a selected charge pump and may supply a power supply voltage to the power mesh 400.

The controller 320 may output a control signal CTR, and operations of the oscillator 330 and the comparator circuit 340 may be controlled by the control signal CTR. For example, the oscillator 330 may output a clock signal CLK to a charge pump selected from among the plurality of charge pumps 311-313, and an amount of charge supplied to the selected charge pump may be determined according to a frequency of the clock signal CLK. For example, when a frequency of the clock signal CLK increases, the amount of charge supplied to the selected charge pump may increase.

The comparator circuit 340 may include a first voltage divider circuit 341, a second voltage divider circuit 342, and a comparator 343. The comparator 343 may include a first input terminal and a second input terminal, the first input terminal may be connected to the first voltage divider circuit 341, and the second input terminal may be connected to the second voltage divider circuit 342. The first voltage divider circuit 341 may include a plurality of unit resistors 341R and resistor switches RSW1 and RSW2, and the second voltage divider circuit 342 may include a plurality of unit resistors 342R without a resistor switch.

The comparator 343 may output the enable signal EN by comparing a reference voltage, which may be the voltage of the first intermediate node MN1 of the first voltage divider circuit 341, with the feedback voltage, which may be the voltage of the second intermediate node MN2 of the second voltage divider circuit 342. In an example embodiment according to FIG. 5, when the voltage of the first intermediate node MN1 is greater than the voltage of the second intermediate node MN2, the enable signal EN may be determined to be a first level, and when the voltage of the first intermediate node MN1 is less than the voltage of the first intermediate node MN2, the enable signal EN may be determined to be a second level less than the first level.

The enable signal EN may determine whether the oscillator 330 operates. For example, when the enable signal EN is at the first level, the oscillator 330 may output the clock signal CLK to the selected charge pump, and when the enable signal EN is at the second level, the oscillator 330 may stop outputting the clock signal CLK.

The voltage of the first intermediate node MN1 may be determined by the control signal CTR output by the controller 320. For example, the first resistor switch RSW1 may be turned on/off by a complementary signal of the control signal CTR output by the inverter INV, and the second resistor switch RSW2 may be turned on/off by the control signal CTR. As described above with reference to FIG. 4, when the first resistor switch RSW1 is turned on, the voltage of the first intermediate node MN1 may increase, and when the second resistor switch RSW2 is turned on, the voltage of the first intermediate node MN1 may decrease. The voltage of the second intermediate node MN2 may not be affected by the control signal CTR and may be determined by the sensing voltage VDET detected from the power mesh 400.

The controller 320 may determine the turning on/off of each of the first resistor switch RSW1 and the second resistor switch RSW2 in consideration of the target level of the power supply voltage to be determined in the power mesh 400. When the power supply voltage of the power mesh 400 is unintentionally reduced, the voltage of the second intermediate node MN2 may be lower than the voltage of the first intermediate node MN1. In this case, the enable signal EN may be determined to (e.g., set to) the first level, and as the oscillator 330 outputs the clock signal CLK and the selected charge pump outputs the output current IOUT to the power mesh 400, charges may be supplied to the mesh 400.

When the power supply voltage of the power mesh 400 is maintained at or higher than the target level, the voltage of the second intermediate node MN2 may be about equal to or greater than the voltage of the first intermediate node MN1. In this case, when the enable signal EN is determined to (e.g., set to) the second level, and as the oscillator 330 stops outputting the clock signal CLK, the operations of the select charge pump may stop.

The plurality of charge pumps 311-313 included in the charge pump circuit 310 may include pumping capacitors having different capacitances. For example, the first pumping capacitor included in the first charge pump 311, the second pumping capacitor included in the second charge pump 312, and the Nth pumping capacitor included in the Nth charge pump 313 may have different capacitances.

The magnitude of the ripple component included in the power supply voltage supplied to the power mesh 400 may be varied according to the capacitance of the pumping capacitor. For example, as the capacitance of the pumping capacitor decreases, the magnitude of a ripple component included in the power supply voltage may also decrease. However, when the charge pump having a pumping capacitor of small capacitance supplies the output current IOUT to the power mesh 400, the amount of charge supplied by the output current IOUT may decrease.

In an example embodiment, the controller 320 may select an optimal charge pump which may stably reduce the ripple component of the power supply voltage and may stably secure the amount of supplied charge with reference to the target level TG of the power supply voltage to be supplied to the power mesh 400 and PI, VI, and TI (PVT) information of the semiconductor device including the voltage generator 300. Accordingly, the power supply voltage of the power mesh 400 may be stably maintained.

For example, the magnitude of the ripple component included in the power supply voltage may decrease as the target level of the power supply voltage increases, and the ripple component may decrease as the capacitance of the pumping capacitor included in the charge pump supplying the output current IOUT decreases. In an example embodiment, when the target level of the power supply voltage to be determined in the power mesh 400 is high, the controller 320 may select a charge pump including a pumping capacitor of large capacitance from the charge pump circuit 310. Also, when the target level of the power supply voltage to be determined in the power mesh 400 is low, the controller 320 may select a charge pump including a pumping capacitor of small capacitance from the charge pump circuit 310. Accordingly, an increase in a ripple component due to the target level of the power supply voltage may be reduced, and the power supply voltage of the power mesh 400 may be stably maintained at the target level.

The PVT information (PI, VI, TI) may include process information PI indicating process deviation, voltage information VI corresponding to the level of an external power supply voltage supplied to the semiconductor device including the voltage generator 300 by an external host, and temperature information TI indicating a temperature detected by a temperature sensor included in the semiconductor device together with the voltage generator 300. The controller 320 may determine a selected charge pump supplying the output current IOUT to the power mesh 400 among the plurality of charge pumps 311-313 with reference to at least one of the process information PI, the voltage information VI, and the temperature information TI.

Also, the controller 320 may control the operations of the selected charge pump with reference to at least one of the process information PI, the voltage information VI, the temperature information TI, and the target level TG. For example, when the level of the external power supply voltage and/or the target level TG included in the voltage information VI increases, the controller 320 may output the control signal CTR controlling the oscillator 330 to increase the frequency of the clock signal CLK. Also, when the temperature included in the temperature information TI increases, the controller 320 may output the control signal CTR for controlling the oscillator 330 to decrease the frequency of the clock signal CLK. However, example embodiments are not limited thereto, and the method of the controller 320 controlling the oscillator 330 according to the process information PI, the voltage information VI, and the temperature information TI may be varied.

Figure 6:
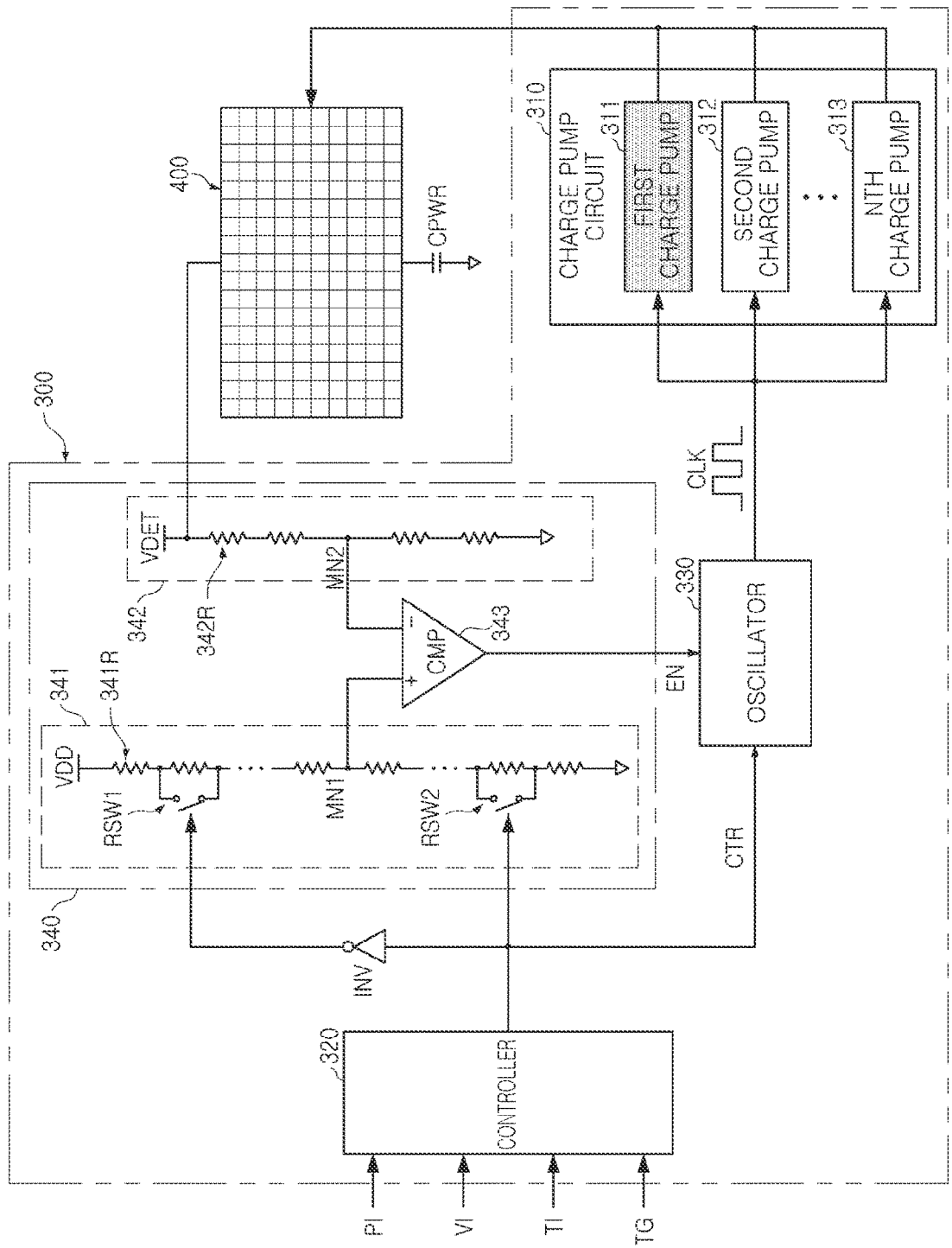
FIGS. 6 and 7 are diagrams illustrating operations of a voltage generator according to an example embodiment of the present disclosure.
Figure 7:
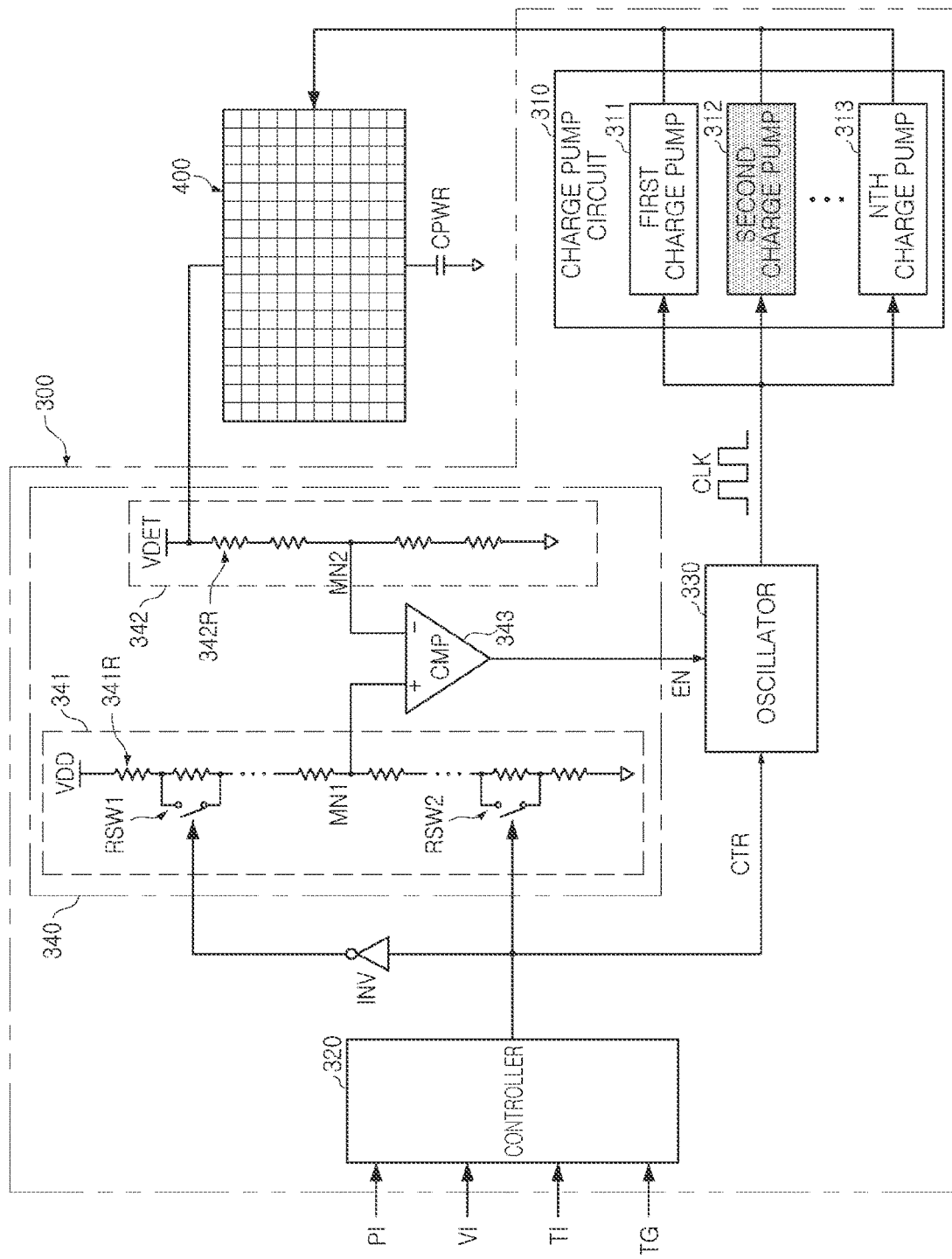

FIGS. 6 and 7 are diagrams illustrating operations of a voltage generator according to an example embodiment.

In an example embodiment described with reference to FIGS. 6 and 7, the voltage generator 300 may have the same structure as described with reference to FIG. 5 above. Referring to FIGS. 6 and 7, the voltage generator 300 may include a charge pump circuit 310 including a plurality of charge pumps 311-313, a controller 320, an oscillator 330, and a comparator circuit 340.

The selected charge pump actually operating among the plurality of charge pumps 311-313 may be determined by the oscillator 330 with reference to the control signal CTR output by the controller 320. For example, in an example embodiment, the oscillator 330 may output the clock signal CLK only to the selected charge pump with reference to the control signal CTR, and does not output the clock signal CLK to the charge pumps other than the selected charge pump.

Alternatively, the controller 320 may directly select the charge pump. In this case, the control signal CTR may be input to the charge pump circuit 310. For example, the charge pump circuit 310 may include a switch circuit transferring the clock signal CLK output by the oscillator 330 to a charge pump selected from among the plurality of charge pumps 311-313 according to the control signal CTR. For example, the switch circuit may include a demultiplexer.

For example, a capacitance of each of the plurality of first pumping capacitors included in the first charge pump 311 may be smaller than a capacitance of each of the plurality of second pumping capacitors included in the second charge pump 312. For example, the capacitance of each of the second pumping capacitors may be at least twice the capacitance of each of the first pumping capacitors.

The controller 320 may determine the first charge pump as the selected charge pump when the target level of the power supply voltage to be supplied to the power mesh 400 is relatively low, and when the target level of the power supply voltage is relatively large, the controller 320 may determine the second charge pump as the selected charge pump. For example, the controller 320 may compare the target level of the power supply voltage with a predetermined reference level, and the controller 320 may select the first charge pump when the target level is about equal to or less than the reference level, and the controller 320 may select the second charge pump when the target level is greater than the reference level.

As described above, as the target level increases, a ripple component included in the power supply voltage may decrease, and as the target level decreases, the ripple component included in the power supply voltage may increase. Also, as the capacitance of the pumping capacitor included in the selected charge pump increases, a ripple component included in the power supply voltage may increase, and as the capacitance of the pumping capacitor decreases, the ripple component included in the power supply voltage may decrease.

In an example embodiment, the controller 320 may select the first charge pump including pumping capacitors of small capacitance when the target level is low. Accordingly, an increase in the ripple component due to the small target level may be offset by the first charge pump including the pumping capacitor of small capacitances. When the target level is high, the controller 320 may select the second charge pump including pumping capacitors of large capacitance. Accordingly, the power supply voltage of a high target level may be effectively maintained by the second charge pump including the pumping capacitors of large capacitance.

Figure 8A:
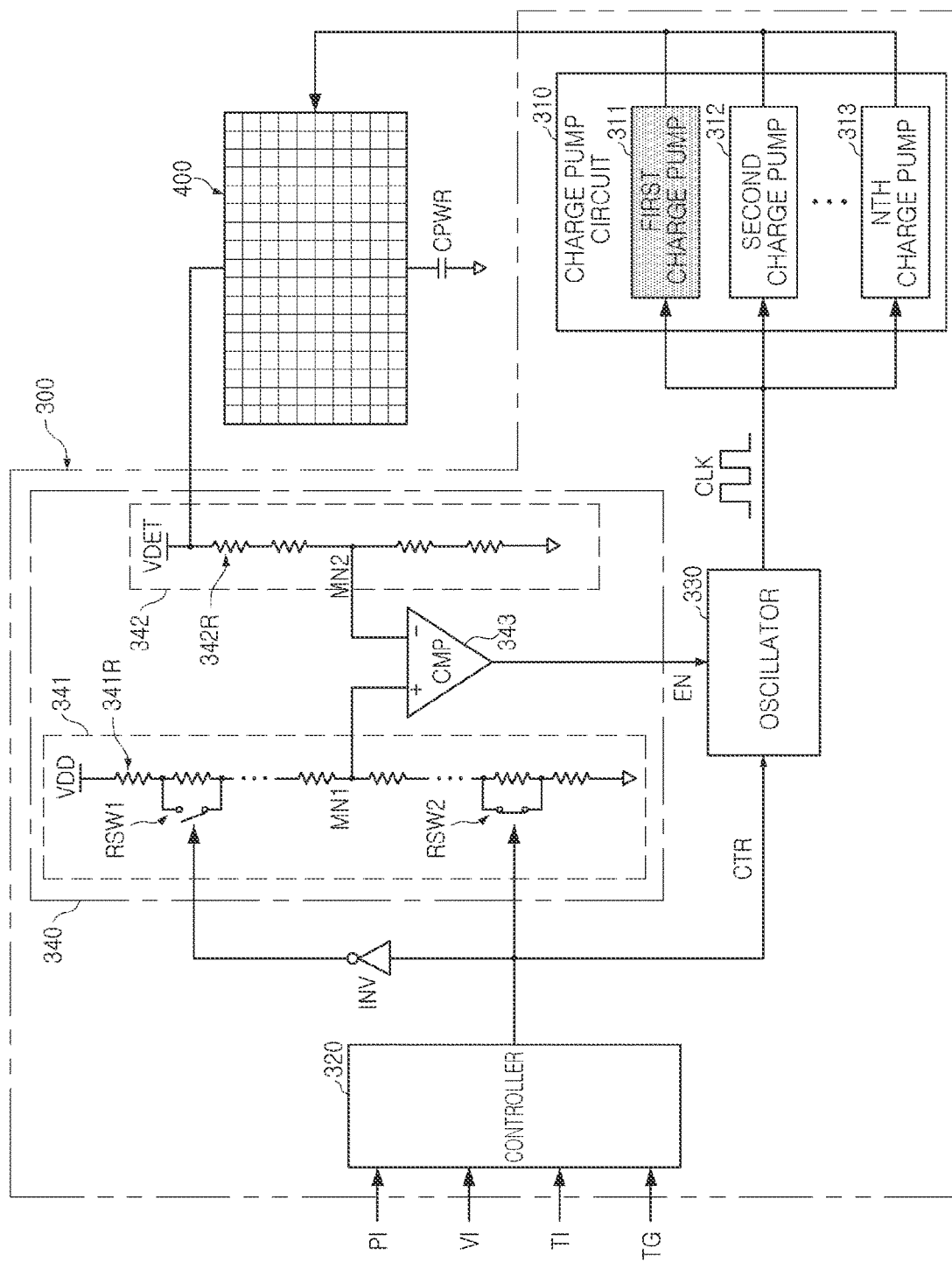
FIGS. 8A and 8B are diagrams illustrating operations of a voltage generator according to an example embodiment of the present disclosure.
Figure 8B:
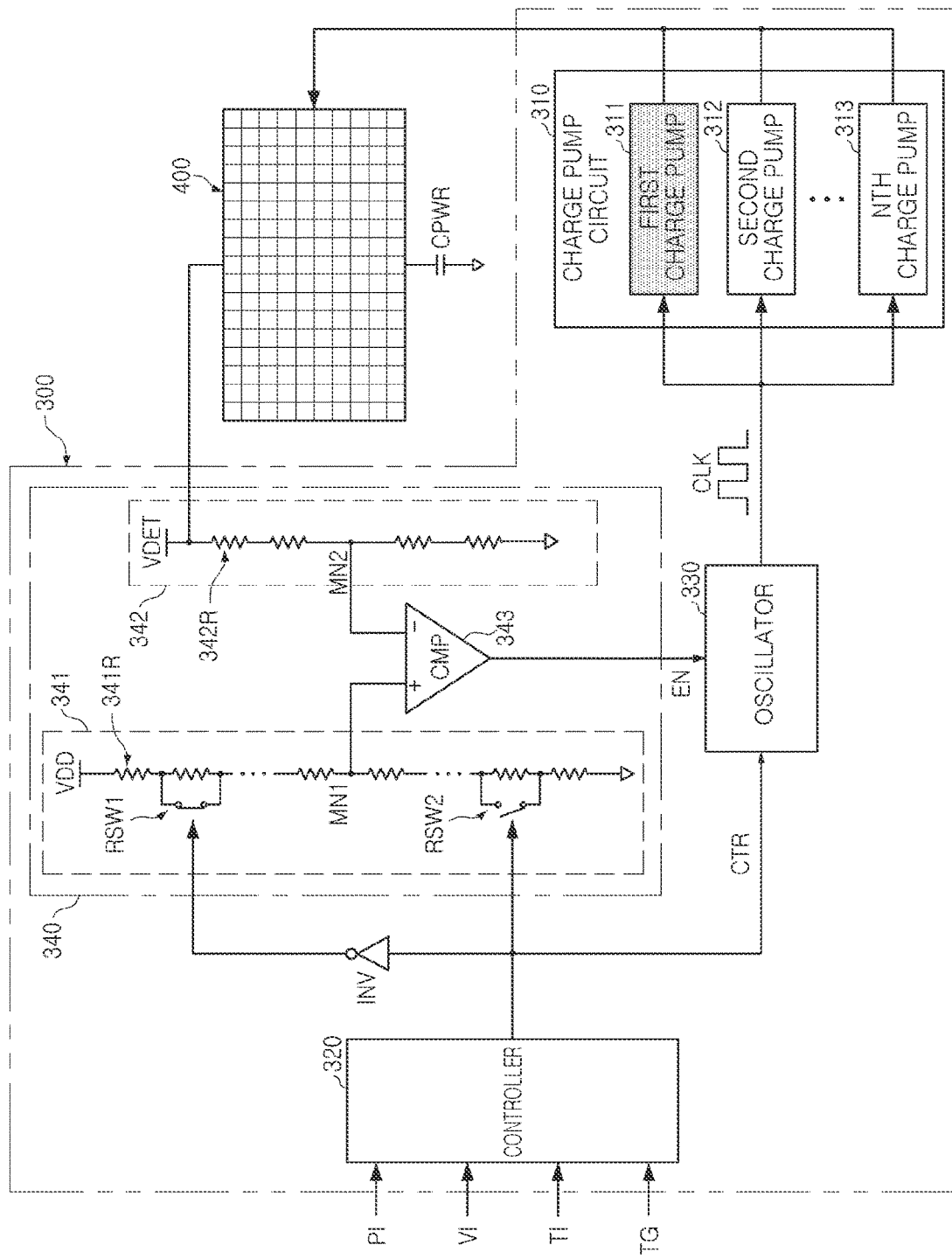

FIGS. 8A and 8B are diagrams illustrating operations of a voltage generator according to an example embodiment.

In an example embodiment described with reference to FIGS. 8A and 8B, the voltage generator 300 may have the same structure as described with reference to FIG. 5 above. Referring to FIGS. 8A and 8B, the voltage generator 300 may include a charge pump circuit 310 including a plurality of charge pumps 311-313, a controller 320, an oscillator 330, and a comparator circuit 340.

In an example embodiment described with reference to FIGS. 8A and 8B, the selected charge pump may be the first charge pump 311. In an example embodiment illustrated in FIGS. 8A and 8B, whether the oscillator 330 outputs the clock signal CLK to the first charge pump 311 may change by the comparator circuit 340.

First, referring to FIG. 8A, in response to the control signal CTR output by the controller 320, the first resistor switch RSW1 included in the first voltage divider circuit 341 may be turned off, and the second resistor switch RSW2 may be turned. Accordingly, the reference voltage, which may be the voltage of the first intermediate node MN1, may be determined to be relatively high.

In the description below, referring to FIG. 8B, in response to the control signal CTR output by the controller 320, the first resistor switch RSW1 included in the first voltage divider circuit 341 may be turned on, and the second resistor switch RSW2 may be turned off. Accordingly, the reference voltage, which may be the voltage of the first intermediate node MN1, may be determined to be relatively low.

The oscillator 330 may be activated or deactivated by the enable signal EN. For example, in an example embodiment, when the enable signal EN is at the first level, the oscillator 330 may output the clock signal CLK to the first charge pump 311 which is the selected charge pump, and when the enable signal EN is at the second level smaller than the first level, the oscillator 330 does not output the clock signal CLK to the first charge pump 311. In an example embodiment described with reference to FIGS. 8A and 8B, the oscillator 330 may output the clock signal CLK to the first charge pump 311 until the feedback voltage of the second intermediate node MN2 determined by the sensing voltage VDET detected from the power mesh 400 reaches a reference voltage.

Accordingly, in an example embodiment according to FIG. 8A, the time in which the oscillator 330 outputs the clock signal CLK may be longer than the time in which the oscillator 330 outputs the clock signal CLK. When the amount of charge supplied to the voltage generator 300 is to be increased, for example, when the target level TG of the power supply voltage to be determined in the power mesh 400 is high, or when a decrease in the level of the power supply voltage is detected from the power mesh 400, the controller 320 may output the control signal CTR for turning off the first resistor switch RSW1 and turning on the second resistor switch RSW2 as illustrated in FIG. 8A. When the power supply voltage of the power mesh 400 is stably maintained at the target level, the controller 320 may output the control signal CTR for turning on the first resistor switch RSW1 and turning off the second resistor switch RSW2 as illustrated in FIG. 8B, and may reduce power consumption of the voltage generator 300.

Figure 9:
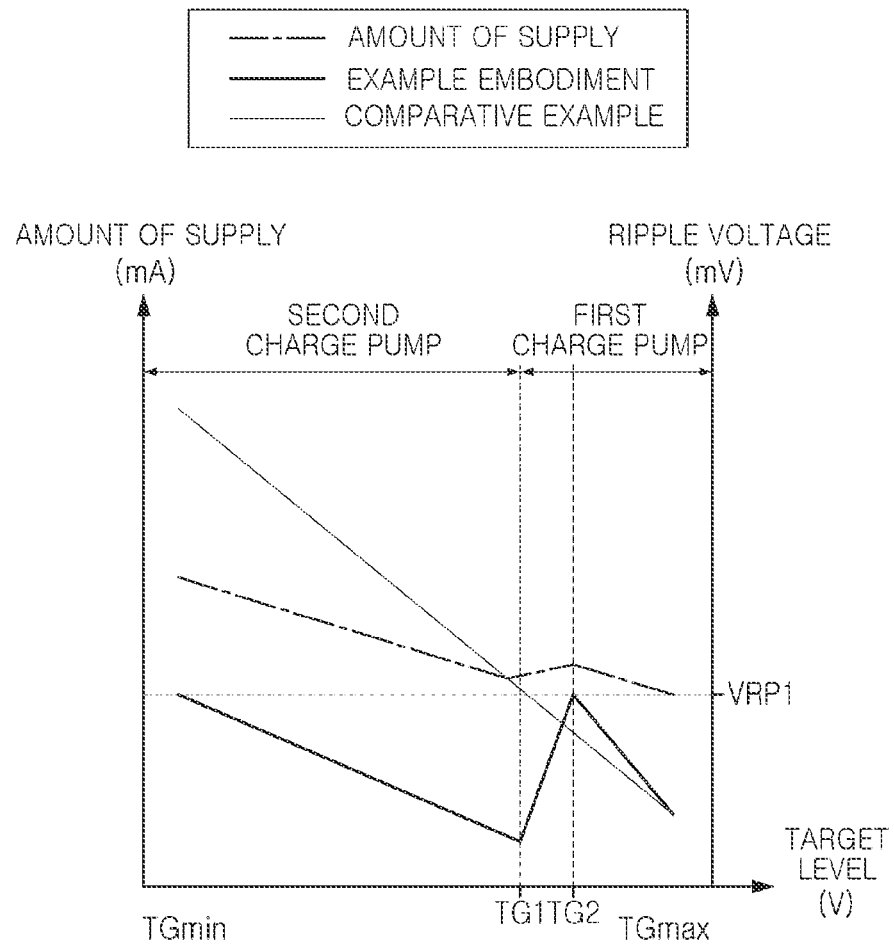
FIG. 9 is a diagram illustrating operations of a voltage generator according to an example embodiment of the present disclosure.

FIG. 9 is a diagram illustrating operations of a voltage generator according to an example embodiment.

Referring to FIG. 9, the voltage generator in an example embodiment may select one of a plurality of charge pumps according to a target level of a power supply voltage to be supplied to a power mesh. In an example embodiment according to FIG. 9, the voltage generator may include a first charge pump and a second charge pump, and the capacitance of the pumping capacitor included in the first charge pump may be smaller than the capacitance of the pumping capacitor included in the second charge pump.

FIG. 9 is a graph illustrating the magnitude of the ripple component according to the target level of the power supply voltage and the amount of charge supplied by the voltage generator. Referring to FIG. 9, a comparative example and an example embodiment with respect to the magnitude of the ripple component together with the amount of charge supplied are illustrated as graphs. The target level may be selected from a range between the minimum target level TGmin and the maximum target level TGmax.

For example, when the target level is about equal to or less than the first target level TG1, the voltage generator may control the first charge pump to supply charges to the power mesh. When the target level is small, the magnitude of the ripple component in the power supply voltage may relatively increase. Accordingly, by selecting the first charge pump including the pumping capacitor having a relatively low capacitance, the increase in the magnitude of the ripple component may be reduced.

When the target level is greater than the first target level TG1, the voltage generator may control the second charge pump to supply charges to the power mesh. When the target level is large, the magnitude of the ripple component in the power supply voltage may be relatively low. Accordingly, when the target level is large, the second charge pump having a large ripple component during operations may be selected, and a sufficient amount of charge may be secured.

The comparative example of the magnitude of the ripple component in FIG. 9 may correspond to the example in which the second charge pump supplies charges to the power mesh regardless of the target level. Accordingly, a ripple component greater than the first ripple voltage VRP1 may appear in the power supply voltage at a target level smaller than the first target level TG1.

In an example embodiment, by selecting the first charge pump at a target level smaller than the first target level TG1, the magnitude of the ripple component in the entire range of the target level may be limited to be about equal to or less than the first ripple voltage VRP1 as illustrated in FIG. 9. By limiting the magnitude of the ripple component included in the power supply voltage, a circuit operating by receiving the power supply voltage from the power mesh may operate stably.

Referring to FIG. 9, in a section in which the target level is greater than the first target level TG1 and smaller than the second target level TG2, the magnitude of the ripple component may increase as the target level increases. However, in a section in which the target level is greater than the second target level TG2, the magnitude of the ripple component may decrease as the target level increases again, and accordingly, the magnitude of the ripple component may be limited to be about equal to or less than the first ripple voltage VRP1.

Figure 10:
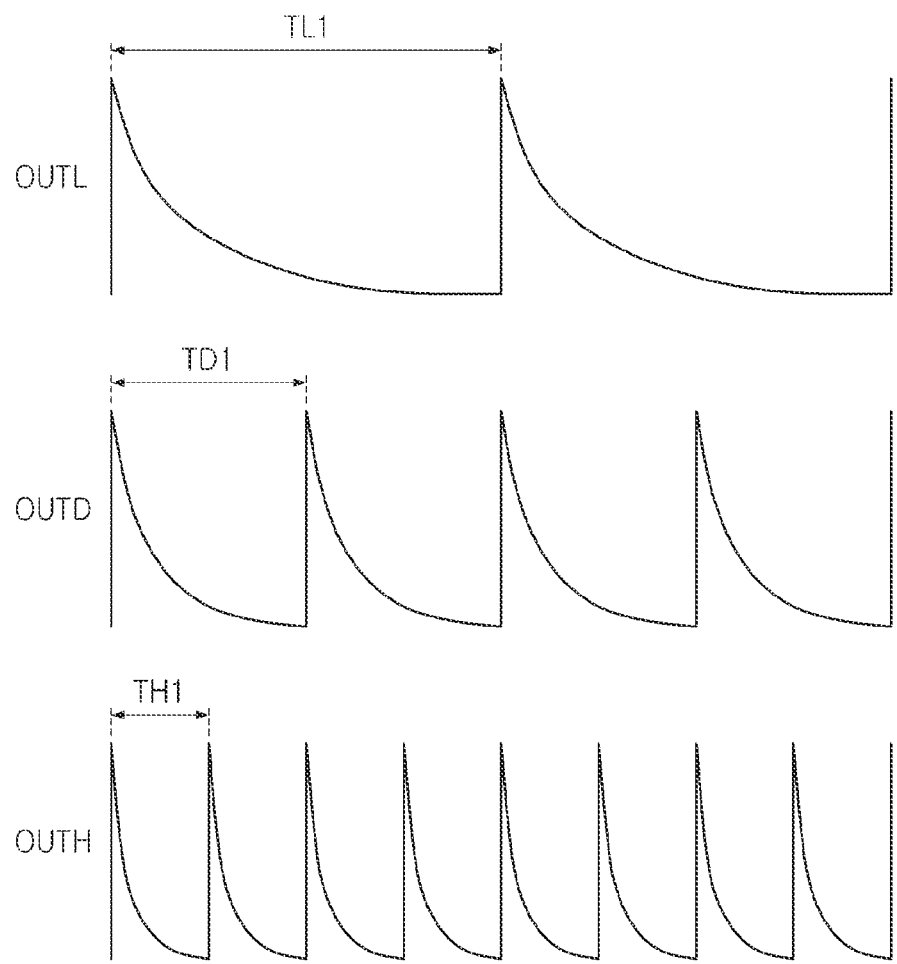
FIGS. 10 to 12 are diagrams illustrating operations of a voltage generator according to an example embodiment of the present disclosure.
Figure 11:
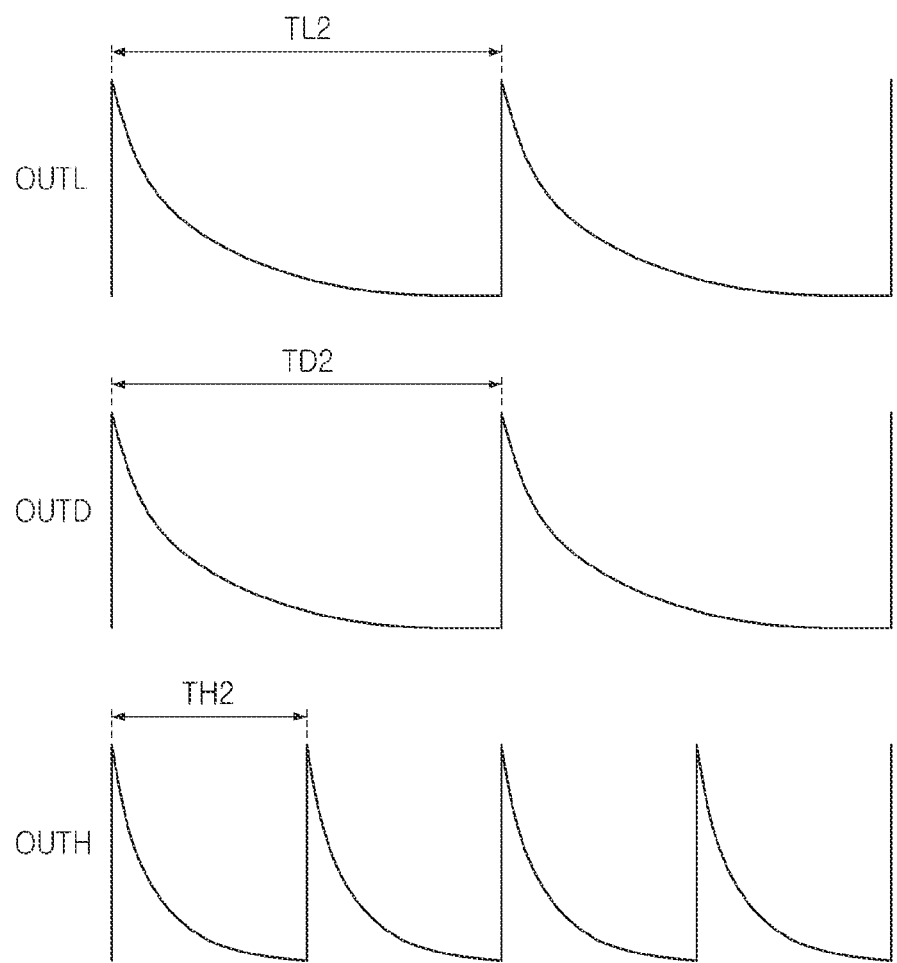
Figure 12:
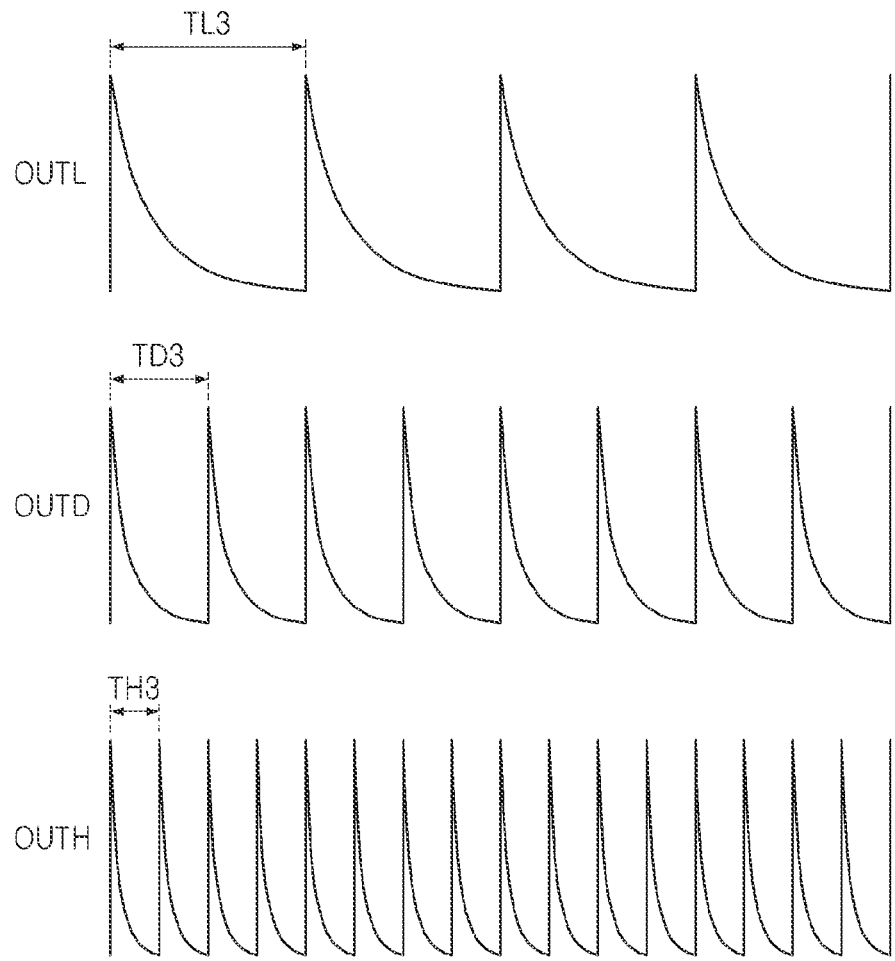

FIGS. 10 to 12 are diagrams illustrating operations of a voltage generator according to an example embodiment.

FIGS. 10 to 12 may be diagrams illustrating changes in output of a voltage generator according to various information input to a controller of the voltage generator, that is, for example, changes in output of a voltage generator according to a target level of a power supply voltage and/or PVT information. For example, FIG. 10 illustrates an output of a voltage generator when process information is a first process value among PVT information, and FIG. 11 illustrates an output of a voltage generator when process information is a second process value. FIG. 12 illustrates an output of a voltage generator when process information is a third process value.

For example, the first process value may correspond to an example in which a process change in a manufacturing process for manufacturing a semiconductor device including a voltage generator is a typical-typical corner of a nominal case. The second process value may correspond to a low speed corner exhibiting an effective drive current having process variation less than nominal and small leakage current, and the third process value may correspond to a low speed corner exhibiting an effective drive current having process change less than nominal and a large leakage current.

Referring to FIG. 10, when the process information is a first process value, the basic output current OUTD output by the voltage generator may have a first basic period TD1. The basic output current OUTD may have the same period as a clock signal initially determined by an oscillator included in the voltage generator as a default.

As described above, the oscillator may change the frequency of the clock signal in response to a control signal received from the controller. As illustrated in FIG. 10, the oscillator may output a low output current OUTL by lowering the frequency of the clock signal or may output a high output current OUTH by increasing the frequency of the clock signal. The first low period TL1 of the low output current OUTL may be longer than the first basic period TD1, and the first high period TH1 of the high output current OUTH may be shorter than the first basic period TD1.

In the description below, referring to FIG. 11, when the process information is the second process value, the basic output current OUTD output by the voltage generator may have the second basic period TD2. Referring to FIGS. 10 and 11 together, the second basic period TD2 may be longer than the first basic period TD1, which may be because when the process information representing the process change of the semiconductor device is the second process value, the effective driving current and the leakage current of the transistor included in the semiconductor device may decrease. Accordingly, the current properties of the transistor may decrease and the response speed may also decrease, such that the frequency of the initially output basic output current OUTD may decrease as illustrated in FIG. 11.

Accordingly, in an example embodiment according to FIG. 11, when the selected charge pump supplies charges to the power mesh with the basic output current OUTD, the power supply voltage of the power mesh does not increase to the target level or the rate of increase of the power supply voltage may decrease. Accordingly, when the process information is the second process value, the controller may output a control signal for controlling the oscillator to output a clock signal having a higher frequency than a default clock signal.

The oscillator may, in response to the control signal received from the controller, lower the frequency of the clock signal, and may output the signal or may increase the frequency of the clock signal and may output the signal. However, in an example embodiment as illustrated in FIG. 11, the second row period TL2 of the low output current OUTL output by the selected charge pump in response to the clock signal having the lowered frequency is not longer than the second basic period TD2. The second high period TH2 of the high output current OUTH may be shorter than the second basic period TD2, and accordingly, the controller may increase the amount of charge delivered to the power mesh by increasing the frequency of the clock signal.

Referring to FIG. 12, when the process information is the third process value, the basic output current OUTD output by the voltage generator may have a third basic period TD3. Referring to FIGS. 10 and 12 together, the third basic period TD3 may be shorter than the first basic period TD1, which may be because when the process information representing the process change of the semiconductor device is the third process value, the effective driving current and the leakage current of the transistor included in the semiconductor device may increase. Accordingly, the frequency of the basic output current OUTD output by the selected charge pump may increase in response to the initially set clock signal, and the amount of charge supplied may also increase.

Unlike an example embodiment as illustrated in FIG. 11, in an example embodiment as illustrated in FIG. 12, when the selected charge pump is driven with a clock signal initially determined by the oscillator, excessive charge may be supplied to the power mesh. Accordingly, when the process information is the third process value, the controller may output a control signal for controlling the oscillator to reduce the frequency of the initially determined clock signal. In this case, the selected charge pump may output a low output current OUTL.

FIGS. 13 to 16 are diagrams illustrating operations of a voltage generator according to an example embodiment.

Figure 13:
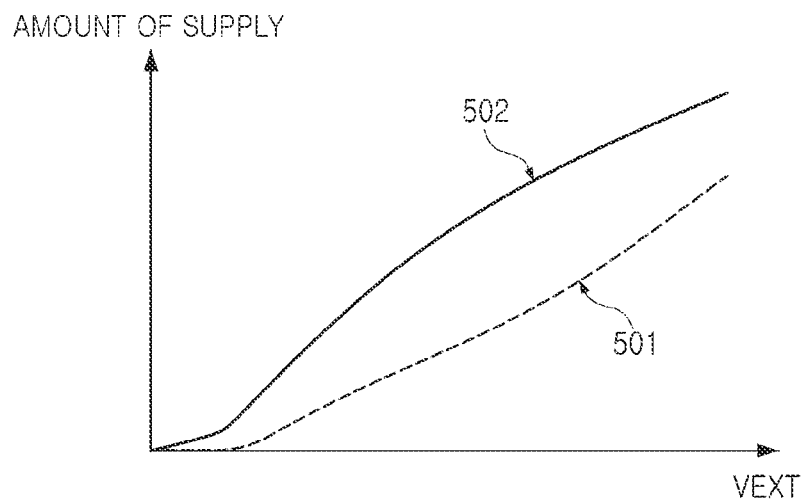
FIGS. 13 to 16 are diagrams illustrating operations of a voltage generator according to an example embodiment of the present disclosure.

FIG. 13 illustrates the amount of charge supplied by the voltage generator according to voltage information received by the controller of the voltage generator. Referring to FIG. 13, the voltage information may include the level of the external power supply voltage VEXT, and the external power supply voltage VEXT may be a voltage generated by an external host or an external power device and provided to the semiconductor device including a voltage generator.

Referring to FIG. 13, the amount of charge supplied by the voltage generator may increase as the level of the external power supply voltage VEXT increases. However, even under a condition in which the external power supply voltage VEXT of the same level is applied, the amount of charge output by the voltage generator may be different depending on process information, temperature information, etc. As an example, the first graph 501 indicates an example in which process information has a first process value as described with reference to FIG. 10, and the second graph 502 indicates an example in which process information has a second value. Accordingly, under the condition in which the external power supply voltage VEXT of the same level is input, the amount of charge supply of the voltage generator corresponding to the second graph 502 may be greater than the amount of charge supply of the voltage generator corresponding to the first graph 501.

The controller of the voltage generator may control the oscillator to increase the frequency of the clock signal input to the selected charge pump as the level of the external power supply voltage VEXT received as voltage information increases. Hereinafter, this configuration will be described in greater detail with reference to FIGS. 14 and 15 together.

Figure 14:
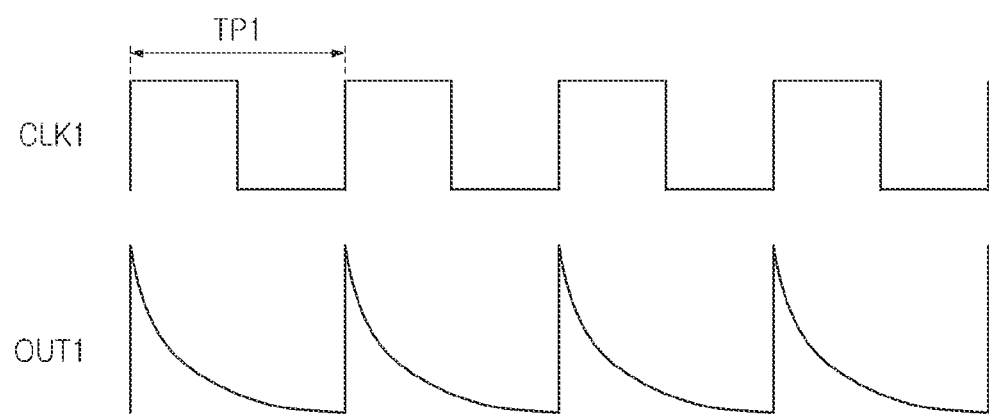
Figure 15:
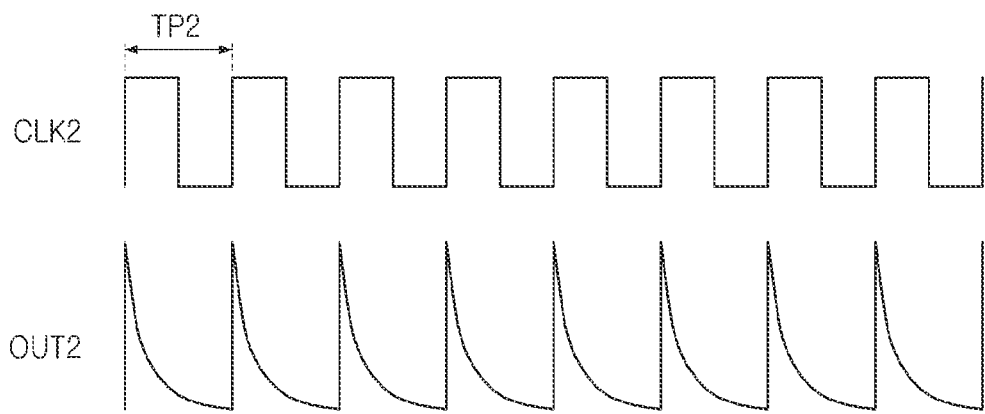

FIGS. 14 and 15 illustrate operations of the voltage generator according to the level of the external power supply voltage VEXT. Referring to FIG. 14, when the oscillator outputs the first clock signal CLK1 having the first period TP1, the selected charge pump selected by the controller may output the first output current OUT1. The power supply voltage of the power mesh connected to the voltage generator may be charged to a target level by the first output current OUT1.

When the external power supply voltage VEXT input to the semiconductor device including the voltage generator increases, the controller may change the control signal such that the oscillator may provide a faster frequency clock signal to the selected charge pump. Referring to FIG. 15, in response to the control of the controller, the oscillator may provide the second clock signal CLK2 having a second period TP2 shorter than the first period TP1 to the selected charge pump.

The selected charge pump may output the second output current OUT2 to the power mesh in response to the second clock signal CLK2. Since the second output current OUT2 having a faster frequency is supplied to the power mesh as compared to FIG. 14, the power supply voltage of the power mesh may be more rapidly charged to a target level.

Referring to an example embodiment described above with reference to FIGS. 8A and 8B, the voltage generator may include a comparator circuit, and the comparator circuit may control whether the oscillator operates or does not operate by comparing a feedback voltage corresponding to a power supply voltage of the power mesh with a reference corresponding to a target level. For example, as illustrated in FIG. 15, when the selected charge pump increases the amount of charge supplied to the power mesh in response to an increase in the external power supply voltage VEXT and the power supply voltage of the power mesh swiftly reaches a target level, the operations of the oscillator may stop.

Figure 16:
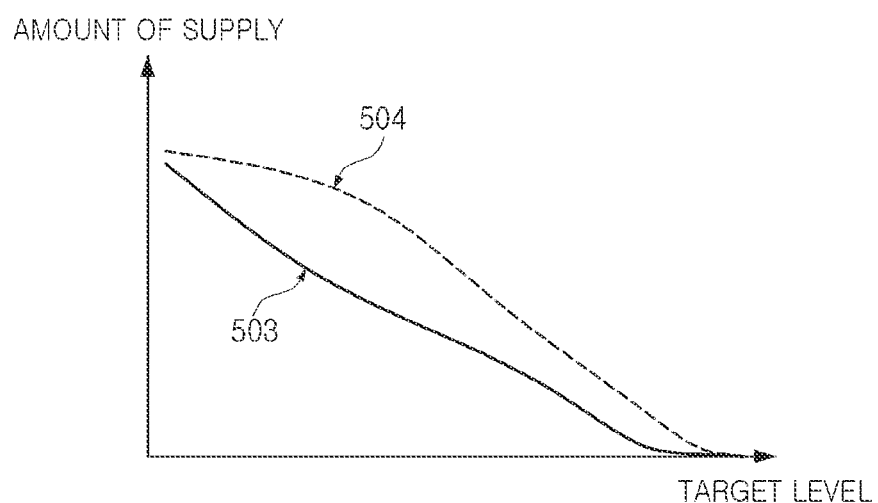

FIG. 16 illustrates the amount of charge supplied by the voltage generator according to the target level of the power supply voltage. Referring to FIG. 16, as the target level increases, the amount of charge supply of the selected charge pump may decrease. However, similar to the example described with reference to FIG. 13, even under a condition in which the power supply voltage of the power mesh is to be increased to the same target level, the amount of charge supplied by the voltage generator may appear differently depending on process information, temperature information, etc. For example, as the process information has different process values, the amount of charge supplied according to the target level in each of the semiconductor devices may be displayed as illustrated in the first graph 503 and the second graph 504.

Figure 17:
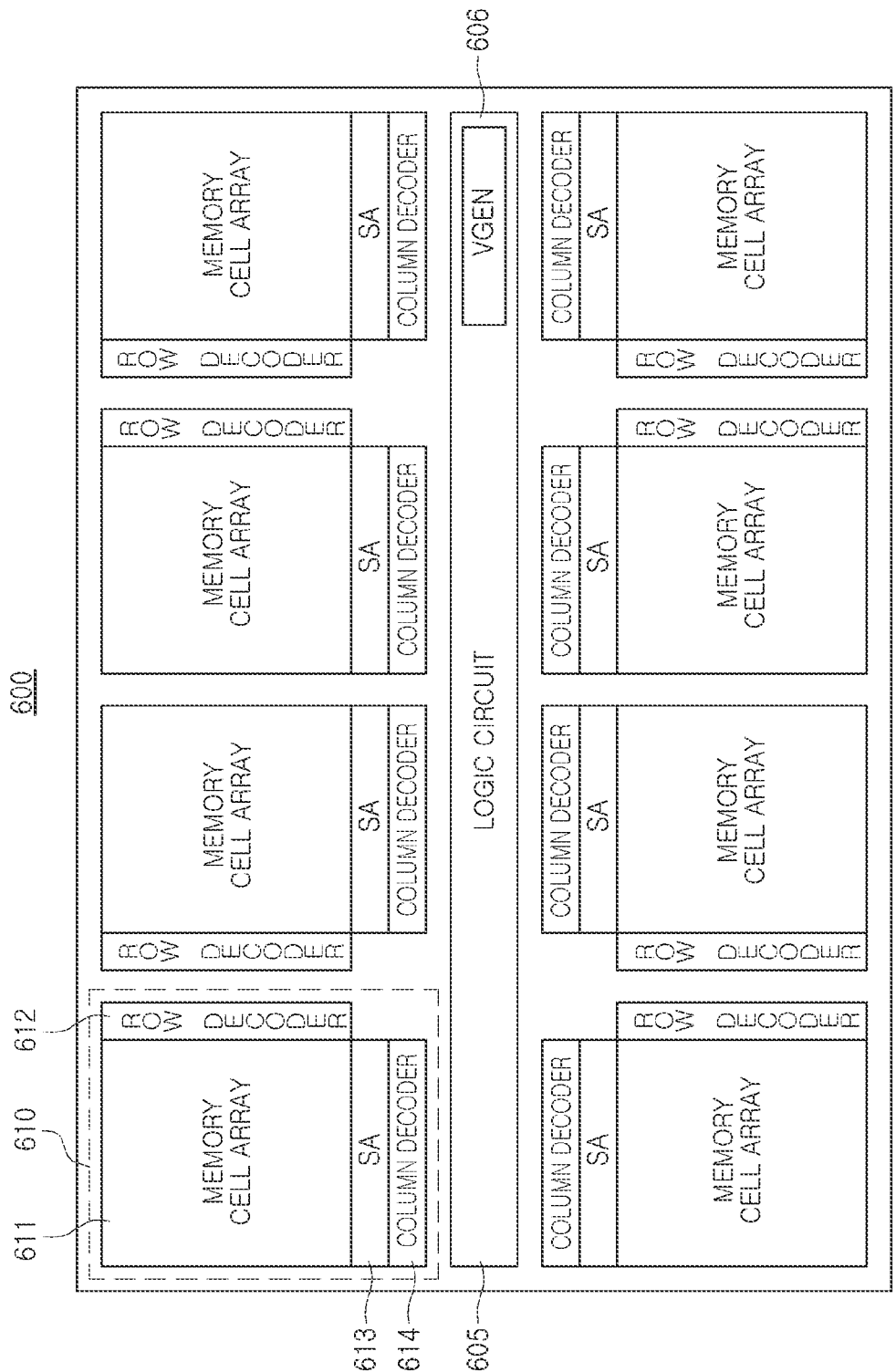
FIG. 17 is a diagram illustrating a semiconductor device according to an example embodiment of the present disclosure.

FIG. 17 is a diagram illustrating a semiconductor device according to an example embodiment.

Referring to FIG. 17, a semiconductor device 600 may be implemented as a memory device and may include a plurality of unit memory regions 610. Herein, the terms "unit memory region" and "memory region" may be used interchangeably. For example, when the semiconductor device 600 is a dynamic random access memory (DRAM), the unit memory region 610 may be defined as a memory bank. Each of the plurality of unit memory regions 610 may include a memory cell array 611, a row decoder 612, a sense amplifier circuit 613, and a column decoder 614.

The operations of the semiconductor device 600 may be controlled by the logic circuit 605. The logic circuit 605 may store data received from an external entity in at least one of the plurality of unit memory regions 610, or may read data from at least one of the plurality of unit memory regions 610 and may output the data to an external entity based on the address information received from an external entity.

In each of the plurality of unit memory regions 610, the row decoder 612 may be connected to the memory cell array 611 through a plurality of word lines, and the sense amplifier circuit 613 may be connected to the memory cell array 611 through a plurality of bit lines. At least one of the plurality of word lines and at least one of the plurality of bit lines may be selected according to the address information transmitted by the logic circuit 605, and data may be written in the memory cell array 611 by the sense amplifier circuit 613 or data written in the memory cell array 611 may be read.

The logic circuit 605 may include an input/output circuit for transmitting signals to and receiving signals from an external device. Referring to FIG. 17, a plurality of unit memory regions 610 may be disposed on both sides of the logic circuit 605, and the logic circuit 605 may be disposed in a center region of the semiconductor device 600. Accordingly, by forming the semiconductor device 600 in a center pad structure in which pads are disposed in the center, wiring patterns connecting the input/output circuit of the logic circuit 605 to the pads may be efficiently designed.

The logic circuit 605 may include a voltage generator 606. The voltage generator 606 may generate a power supply voltage utilized for operations of each of the unit memory regions 610 and/or the logic circuit 605 using an external power supply voltage provided by an external power supply device such as a power management integrated circuit (PMIC) or an external host. For example, a power supply voltage utilized for operations of each of the unit memory regions 610 may be supplied from the voltage generator 606. Each of the unit memory regions 610 may include a power mesh formed in a mesh shape, and the voltage generator 606 may supply charges to the power mesh until the voltage level of the power mesh increases to a target level. A power supply voltage may be supplied to each of the unit memory regions 610.

The power supply voltage determined in the power mesh may have a predetermined ripple component by the charge supplied by the voltage generator 606. The magnitude of the ripple component may increase as the target level of the power supply voltage decreases. The magnitude of the ripple component may increase as the capacitance of the pumping capacitor of the charge pump supplying charge to the device decreases as described above. The voltage generator 606 in an example embodiment may include a plurality of charge pumps implemented with pumping capacitors having different capacitances, and when the target level of the power supply voltage is low, the charge pump having pumping capacitors of small capacitance may be selected, and when the target level of the power supply voltage is high, a charge pump having pumping capacitors of large capacitance may be selected.

Accordingly, in example embodiments of the present disclosure, the ripple component may be effectively limited such that the magnitude of the ripple component appearing in the power supply voltage of the power mesh does not exceed a predetermined level. Also, the magnitude of the ripple component may be effectively limited, and the amount of charge supplied to the power mesh by the charge pump may be maintained to not decrease below the amount of charge consumed by the power mesh, such that the semiconductor device 600 may operate stably.

According to the aforementioned example embodiments, one of a plurality of charge pumps included in the voltage generator may be adaptively selected and may output a power supply voltage according to a target level of a power supply voltage to be supplied to a power mesh, PVT information of a semiconductor device, etc. A charge pump including a pumping capacitor of a different capacitance may be selected from among the plurality of charge pumps according to the target level and PVT information, and accordingly, deterioration of ripple properties of the power supply voltage caused by the power supply voltage and PVT information may be reduced, and the amount of charge supply of the charge pump may be stably maintained.

As is traditional in the field of the present disclosure, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A voltage generator, comprising:
   a charge pump circuit comprising a first charge pump having a plurality of first pumping capacitors, and a second charge pump having a plurality of second pumping capacitors,
   wherein the charge pump circuit is configured to supply a power supply voltage to a power mesh;
   a controller configured to output a control signal based on a target level of the power supply voltage; and
   an oscillator configured to output a clock signal to the charge pump circuit,
   wherein the oscillator outputs the clock signal to one of the first charge pump and the second charge pump based on the control signal,
   a capacitance of each of the plurality of first pumping capacitors is smaller from a capacitance of each of the plurality of second pumping capacitors,
   when the target level is about equal to or less than a predetermined reference level, the controller generates the control signal such that the oscillator outputs the clock signal to the first charge pump, and
   when the target level is greater than the predetermined reference level, the controller generates the control signal such that the oscillator outputs the clock signal to the second charge pump.

2. The voltage generator of claim 1, further comprising:
   a first voltage divider circuit configured to provide a reference voltage determined based on the control signal;
   a second voltage divider circuit configured to provide a feedback voltage determined based on a voltage detected from the power mesh; and
   a comparator circuit comprising a comparator configured to compare the reference voltage with the feedback voltage,
   wherein an enable signal output by the comparator is input to the oscillator.

3. The voltage generator of claim 2, wherein the oscillator outputs the clock signal in response to the enable signal or stops outputting the clock signal.

4. The voltage generator of claim 1, wherein the oscillator adjusts a frequency of the clock signal based on the control signal.

5. The voltage generator of claim 4, wherein the controller determines the control signal based on at least one of the target level and process, voltage, temperature (PVT) information.

6. The voltage generator of claim 5, wherein the control signal output by the controller causes the oscillator to decrease a frequency of the clock signal when an external power supply voltage included in the PVT information increases.

7. The voltage generator of claim 5, wherein the control signal output by the controller causes the oscillator to change a frequency of the clock signal based on the process information included in the PVT information.

8. The voltage generator of claim 5, wherein, when the temperature included in the PVT information increases, the controller controls the oscillator to decrease a frequency of the clock signal.

9. The voltage generator of claim 5, wherein, when the target level increases, the control signal output by the controller causes the oscillator to increase a frequency of the clock signal.

10. The voltage generator of claim 1, wherein the capacitance of each of the plurality of second pumping capacitors is at least twice the capacitance of each of the plurality of first pumping capacitors.

11. The voltage generator of claim 1, wherein the oscillator blocks the clock signal output to the other one of the first charge pump and the second charge pump based on the control signal.

12. A voltage generator, comprising:
a plurality of charge pumps comprising pumping capacitors having different capacitances;
a controller configured to determine a target level of a power supply voltage supplied to a predetermined circuit region through a power mesh and to output a control signal that determines a selected charge pump among the plurality of charge pumps based on the target level; and
an oscillator configured to determine a frequency of a clock signal input to the selected charge pump based on a result of a comparison between a reference voltage determined according to the control signal and a voltage detected by the power mesh.

13. The voltage generator of claim 12, further comprising:
a first voltage divider circuit comprising a plurality of resistors connected between a first power node and a second power node in series;
a first resistor switch connected to a first resistor among the plurality of resistors in parallel; and
a second resistor switch connected to a second unit resistor among the plurality of unit resistors in parallel.

14. The voltage generator of claim 13,
wherein the reference voltage is a voltage of an intermediate node at which a portion of the plurality of resistors are connected to each other, and
wherein the first resistor is connected between the intermediate node and the first power node and the second resistor is connected between the intermediate node and the second power node.

15. The voltage generator of claim 13, wherein the first resistor switch is turned on/off by an inversion signal of the control signal, and the second resistor switch is turned on/off by the control signal.

16. A semiconductor device, comprising:
a plurality of memory regions, each of the plurality of memory regions comprising a power mesh that supplies a power supply voltage; and
a logic circuit configured to control the plurality of memory regions,
wherein the logic circuit comprises a voltage generator configured to set the power supply voltage supplied to the power mesh included in each of the plurality of memory regions to have a predetermined target level,
wherein the voltage generator comprises a plurality of charge pumps configured to supply charges to the power mesh such that a level of the power supply voltage increases to the target level and is maintained at the target level, and a controller configured to select one of the plurality of charge pumps as a selected charge pump based on the target level,
wherein the plurality of charge pumps comprises a first charge pump comprising first pumping capacitors and a second charge pump comprising second pumping capacitors,
wherein a capacitance of each of the second pumping capacitors is greater than a capacitance of each of the first pumping capacitors, and
wherein the controller selects the first charge pump when the target level is about equal to or less than a predetermined reference level, and the controller selects the second charge pump when the target level is greater than the predetermined reference level.

17. The voltage generator of claim 16,
wherein the plurality of charge pumps further comprises a third charge pump comprising third pumping capacitors,
wherein a capacitance of each of the third pumping capacitors is greater than the capacitance of each of the second pumping capacitors,
wherein the reference level is a first reference level, and
wherein the controller selects the third charge pump when the target level is greater than a second reference level which is greater than the first reference level.

18. The voltage generator of claim 16, wherein the controller adjusts an amount of charges supplied to the power mesh by the selected charge pump based on at least one of the target level and a level of an external power supply voltage provided by at least one of an external host and an external power supply.

* * * * *